(12) United States Patent
Kawano et al.

(10) Patent No.: US 7,911,802 B2
(45) Date of Patent: Mar. 22, 2011

(54) INTERPOSER, A METHOD FOR MANUFACTURING THE SAME AND AN ELECTRONIC CIRCUIT PACKAGE

(75) Inventors: Shuichi Kawano, Ogaki (JP); Liyi Chen, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 547 days.

(21) Appl. No.: 11/949,795

(22) Filed: Dec. 4, 2007

(65) Prior Publication Data
US 2008/0247116 A1    Oct. 9, 2008

Related U.S. Application Data

(60) Provisional application No. 60/910,496, filed on Apr. 6, 2007.

(51) Int. Cl.
*H05K 1/18* (2006.01)
(52) U.S. Cl. ........ 361/763; 361/766; 361/793; 361/795; 361/301.1; 361/303; 174/262
(58) Field of Classification Search ............... 361/312, 361/761–764, 766, 767, 790, 793, 795, 784, 361/301.1–301.4, 302–303, 306.1–306.3, 361/299.1–299.3, 299.5, 298.2, 298.3, 298.4; 174/250, 255, 256, 260–267; 257/687, 690, 257/788, 795, 724, 738, 774, 307, 535, 532, 257/306, 303, 763, 698, 516, E27.048, E27.071, 257/E29.342; 333/246, 172, 185, 255
See application file for complete search history.

(56) References Cited

U.S. PATENT DOCUMENTS

| | | | | |
|---|---|---|---|---|
| 5,574,630 A * | 11/1996 | Kresge et al. | ............. | 361/792 |
| 6,970,362 B1 * | 11/2005 | Chakravorty | ............. | 361/782 |
| 7,233,480 B2 * | 6/2007 | Hayashi et al. | ............. | 361/306.3 |
| 2003/0201476 A1 * | 10/2003 | Cheng et al. | ............. | 257/296 |
| 2003/0215619 A1 * | 11/2003 | Ooi et al. | ............. | 428/209 |
| 2005/0000729 A1 * | 1/2005 | Iljima et al. | ............. | 174/260 |
| 2005/0012566 A1 * | 1/2005 | Kushitani et al. | ............. | 333/175 |
| 2006/0076600 A1 * | 4/2006 | Nakabayashi et al. | ............. | 257/298 |
| 2008/0285244 A1 * | 11/2008 | Knickerbocker | ............. | 361/760 |

FOREIGN PATENT DOCUMENTS

| | | |
|---|---|---|
| JP | 2001-177004 | 6/2001 |
| JP | 2001-508948 | 7/2001 |
| JP | 2003-78061 | 3/2003 |
| WO | WO 98/32166 | 7/1998 |

\* cited by examiner

*Primary Examiner* — Dameon E Levi
*Assistant Examiner* — Hoa C Nguyen
(74) *Attorney, Agent, or Firm* — Oblon, Spivak, McClelland, Maier & Neustadt, L.L.P.

(57) ABSTRACT

An interposer including: a substrate including a first layer and second layer, wherein the first layer and second layer are positioned parallel to each other; electrodes each having a concave-convex structure formed on each facing surface of the first layer and second layer of the substrate; a dielectric layer sandwiched between the electrodes which are formed on each facing surface of the first layer and second layer of the substrate; a first conductive part which vertically passes through the first layer of the substrate from a first outer surface of the substrate and is electrically connected to an electrode formed on a surface of the second layer of the substrate that faces the first layer of the substrate; and a second conductive part which vertically passes through the second layer of the substrate from a second outer surface of the substrate and is electrically connected to an electrode formed on a surface of the first layer of the substrate that faces the second layer of the substrate.

13 Claims, 11 Drawing Sheets

INTERPOSER, A METHOD FOR MANUFACTURING THE SAME AND AN ELECTRONIC CIRCUIT PACKAGE

FIELD OF THE TECHNOLOGY

The present invention is related to an interposer having a capacitor to mount electronic components such as an IC, a method for manufacturing the interposer and an electronic circuit package.

BACKGROUND TECHNOLOGY

To prevent noise or the like which occurs in electronic circuits, and to maintain a steady function of semiconductor IC equipment and the like, a capacitor such as a bypass capacitor or a decoupling capacitor is connected between signal terminals and ground circuits, or between power-source terminals and ground circuits of a semiconductor IC component. Also, an interposer made of a silicon substrate is used, for example, between a semiconductor chip and a wiring substrate, or used as a relay substrate to form interlayer interconnections in a semiconductor chip. Technology to form the above-mentioned capacitor in an interposer has been already developed.

For example, a method to form a capacitor on a silicon substrate is described in Published Patent Application 2001-508948 (WO98/32166). The technology to manufacture a silicon capacitor is described in Published Patent Application 2001-508948 as follows: A hole structure is formed in a silicon substrate; a conductive zone is formed by doping the substrate surface, and a dielectric layer and a conductive layer are deposited on the surface without filling the hole structure; also, to offset the mechanical strain on the silicon substrate affected by the doping of the conductive zone, a conformal auxiliary layer under compressive mechanical stress is formed on the surface of the conductive layer.

Conventionally, in a silicon capacitor, capacitor capacitance is expanded by using a trench structure to enlarge the surface. To form capacitors, processes such as CVD or sol-gel methods have been used on interposer surfaces or trenches.

However, in a method in which a silicon capacitor is manufactured by forming a trench structure in a silicon substrate, it is expected that the dielectric in the capacitor will absorb moisture during the manufacturing process of the capacitor, and the leakage of electric current will expand. Furthermore, when the capacitor is installed in a circuit package, potential electric shortages may occur between capacitor electrodes due to the absorbed moisture in the dielectric.

To minimize the circuit package height, an interposer is laminated on a support substrate and then sanded. After the interposer is mounted on the circuit substrate, a step to exfoliate the support substrate is employed. In a conventional capacitor, when a solution treatment is applied to exfoliate the support substrate from the interposer, potential degradation of the electrical characteristics of the capacitor may occur due to solution seepage into the dielectric or bond residue.

SUMMARY OF THE INVENTION

The present invention was designed to overcome the above-described problems. The objective of the present invention is to prevent moisture absorption at the dielectric in a capacitor and to produce a capacitor having little degradation of electrical characteristics.

An interposer related to the first aspect of the present invention is characterized by the following:

a substrate including a first layer and second layer, wherein the first layer and second layer are positioned parallel to each other; electrodes each having a concave-convex structure formed on each facing surface of the first layer and second layer of the substrate; a dielectric layer sandwiched between the electrodes which are formed on each facing surface of the first layer and second layer of the substrate; a first conductive part which vertically passes through the first layer of the substrate from a first outer surface of the substrate and is electrically connected to an electrode formed on a surface of the second layer of the substrate that faces the first layer of the substrate; and a second conductive part which vertically passes through the second layer of the substrate from a second outer surface of the substrate and is electrically connected to an electrode formed on a surface of the first layer of the substrate that faces the second layer of the substrate.

A method for manufacturing the interposer related to the second aspect of the present invention features the following steps:

forming a concave-convex structure on each of two facing surfaces of a first layer and a second layer positioned parallel to each in such a way that a convex portion of the concave-convex structure on the facing surface of the first layer aligns with a concave portion of the concave-convex structure on the facing surface of the second layer;

forming electrodes including a conductive layer on a surface of the first layer and the second layer; and compressing the first layer and the second layer after sandwiching a dielectric layer between them to form a substrate.

An electronic circuit package related to the third aspect of the present invention is characterized by a structure that includes the interposer related to the first aspect of the present invention.

DESCRIPTION OF THE INVENTION

Figure 1:
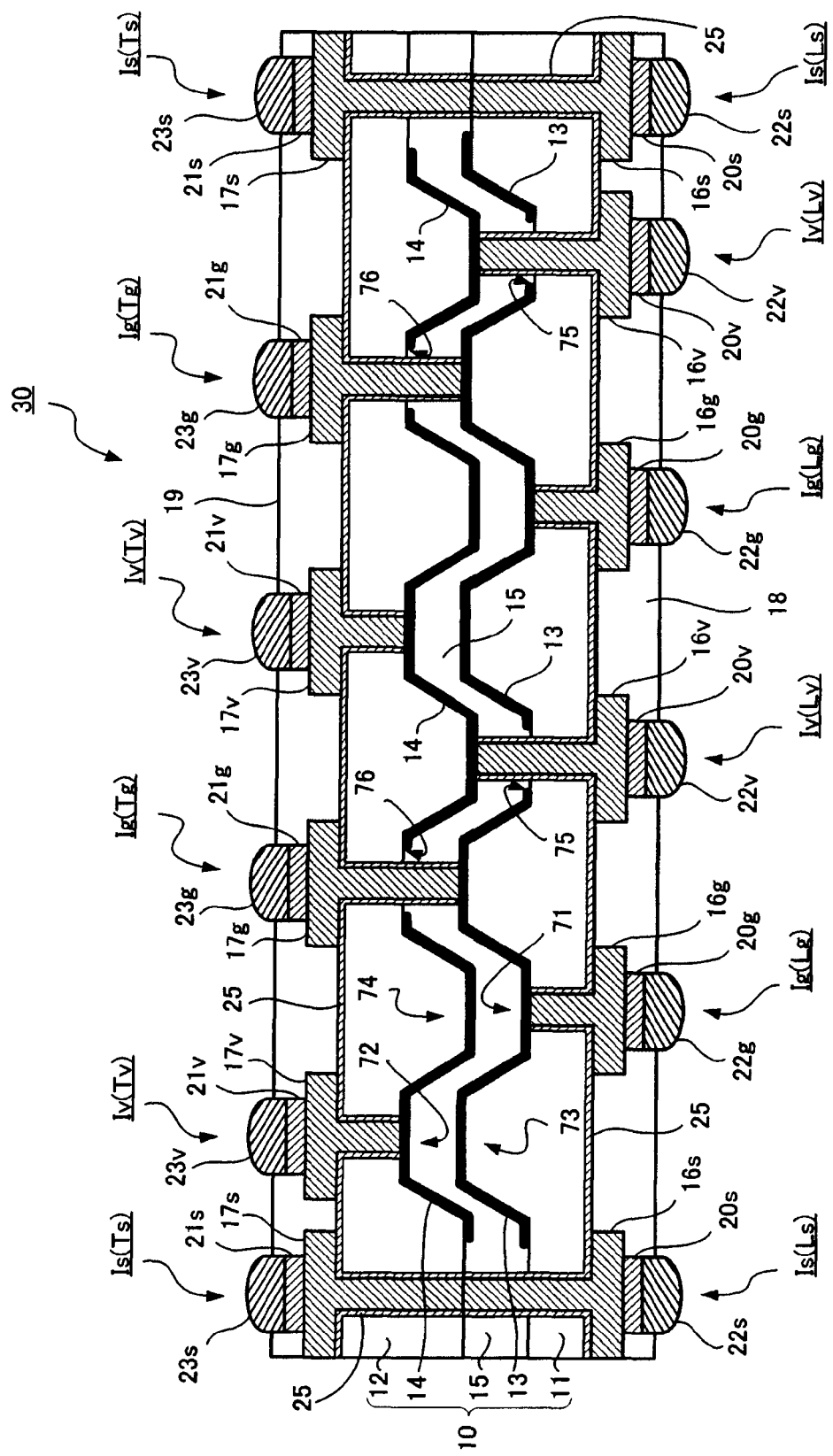
FIG. 1 is a cross-sectional view of the structure of an interposer having a capacitor related to an example of the present invention.

A capacitor and a method for manufacturing the capacitor related to the present invention are described as follows with reference to the drawings. Especially, an example is described where a capacitor is formed in an interposer. The same reference numeral is assigned to a portion which is identical to or corresponds to another portion, and the description for that portion will not be repeated. The sizes of the portions illustrated in each drawing are adjusted appropriately to facilitate a fuller understanding, and thus the size-ratio in the illustrations does not reflect the actual size-ratio between each portion.

Figure 2:
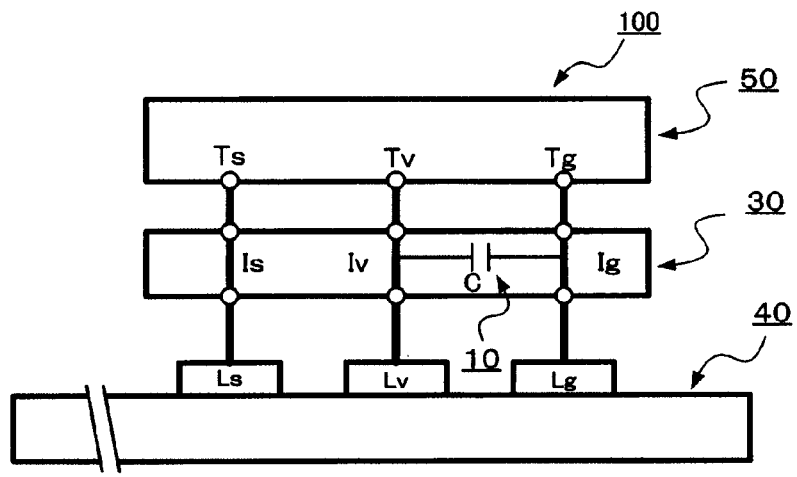
FIG. 2 is an illustration to describe the function of the interposer shown in FIG. 1.

Capacitor 10 relates to an example of the present invention. Capacitor 10 is formed, for example, in interposer 30 as shown in FIG. 1. As schematically illustrated in FIG. 2, interposer 30 is arranged between semiconductor chip 50 and circuit substrate 40 in electronic circuit package 100. Interposer 30 connects power-source terminal (Tv), ground terminal (Tg) and multiple signal terminals (Ts) of semiconductor chip 50 to power-source line (Lv), ground line (Lg) and multiple signal lines (Ls) of circuit substrate 40 through interconnecting conductors (Iv), (Ig) and (Is). At the same time, interposer 30 is a device which connects capacitor C (capacitor 10) between power-source terminal (Tv) and ground terminal (Tg) of semiconductor chip 50 to decrease noise from a power-source.

Figure 3:
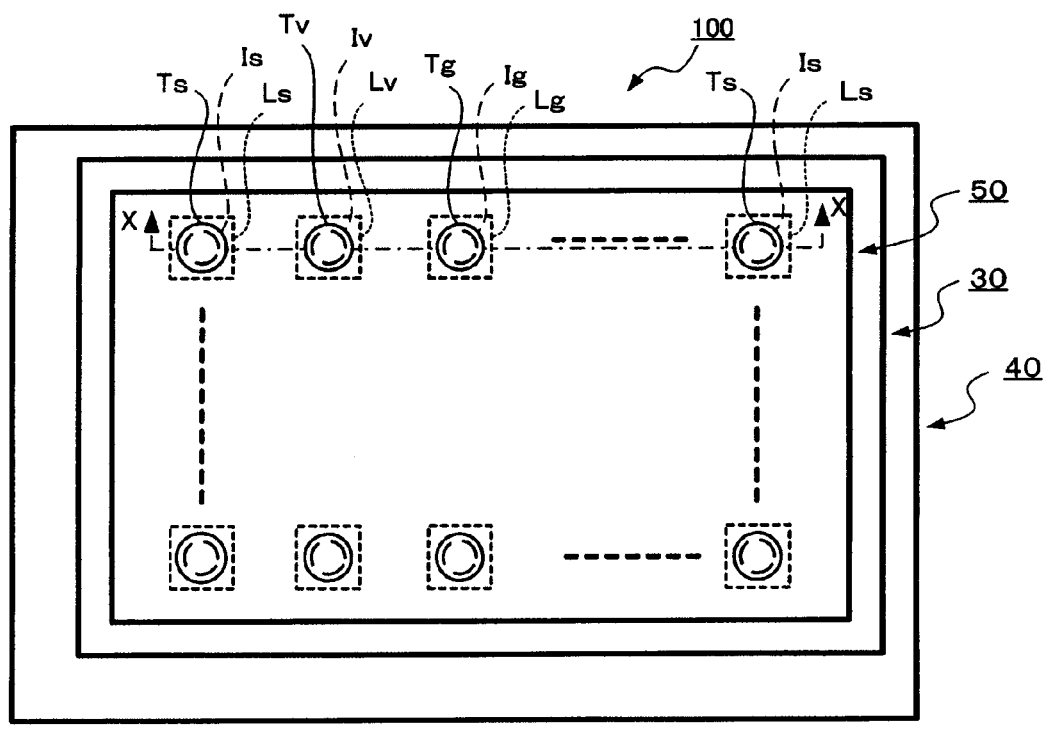
FIG. 3 is an illustration to show relative positions of each electrode of the interposer shown in FIG. 1, a circuit substrate and a semiconductor package.

As shown in a schematically illustrated plane view in FIG. 3, each connecting terminal of semiconductor chip 50, each connecting terminal positioned on both surfaces of interposer 30 and each interconnecting pad of circuit substrate 40 is aligned at relatively the same position or at positions separated by the concave-convex structure of capacitor 10. Electronic circuit package 100 is structured by horizontally aligning and laminating semiconductor chip 50, circuit substrate 40 and interposer 30, thereby connecting each connecting terminal of semiconductor chip 50 to a corresponding connecting pad of circuit substrate 40 by means of interposer 30. The space between circuit substrate 40 and interposer 30 and the space between interposer 30 and semiconductor chip 50 are filled properly with filler such as resin or the like.

Next, structures of capacitor 10 and interposer 30 with mounted capacitor 10 are described as follows.

FIG. 1 illustrates the cross-sectional structure of interposer 30, which corresponds to the cross-section at the X-X line shown in a plane view in FIG. 3. Referring to interconnecting conductors (Iv), (Ig) and (Is) illustrated in FIG. 1, those on the upper surface of interposer 30 are connected to semiconductor chip 50 and those on the lower surface of interposer 30 are connected to circuit substrate 40. Terminals (Tv), (Tg) and (Ts) of semiconductor chip 50 shown in parentheses indicate that they are connected to the upper interconnecting conductors (Iv), (Ig) and (Is) respectively. Also, signal lines (Lv), (Lg) and (Ls) of circuit substrate 40 shown in parentheses indicate that they are connected to the lower interconnecting conductors (Iv), (Ig) and (Is) respectively.

As shown in the FIG. 1, interposer 30 has substrates 11, 12; capacitor 10; terminals (16g), (16s), (16v), (17g), (17s), (17v); insulation layers 18, 19; metal layers (20g), (20s), (20v), (21g), (21s), (21v); bumps (22g), (22s), (22v), (23g), (23s), (23v); and insulation film 25. Capacitor 10 is structured with electrodes 13, 14 and dielectric layer 15. To make the description simple, generalized reference numerals such as terminals 16 (terminals 17 when indicating the upper terminals), metal layers 20 (metal layers 21 when indicating the upper layers) and bumps 22 (bumps 23 when indicating the upper bumps) may be used from now on.

Substrates 11, 12 (structuring capacitor 10) are made of, for example, material such as single crystalline silicon or semiconductor silicon. The thickness of substrates 11, 12 is, for example, approximately 80 μm and support interposer 30 as a whole. Concaves 71, 72 and convexes 73, 74 are formed in substrates 11, 12. Convex 73 of substrate 11 aligns with concave 72 of substrate 12 while maintaining a space in between; convex 74 of substrate 12 aligns with concave 71 of substrate 11 while maintaining a space in between. The depth of concaves 71, 72 (or the height of convexes 73, 74) is, for example, approximately 50 μm. Electrodes 13, 14 are constructed along the concave-convex structures formed on each facing surface of substrates 11, 12. Dielectric layer 15 is sandwiched in the space between substrates 11, 12.

By forming concaves 71, 72 and convexes 73, 74 in substrates 11, 12 to align with one another, the surface size of electrodes 13, 14 per unit surface of interposer 30 is increased while the space is maintained between electrodes 13, 14. Accordingly, the capacitance of capacitor 10 is expanded.

Electrodes 13, 14 are made of conductive material such as a metal, for example, copper (Cu) or the like. The thickness of electrodes 13, 14 is, for example, approximately 0.1 μm. Electrodes 13, 14 have openings 75, 76 to allow terminals (16v), (17g) to vertically pass through electrodes 13, 14 without making contact. The width of openings 75, 76 is, for example, approximately 20 μM.

Dielectric layer 15 is made of resin having a high relative dielectric constant at room temperature or resin containing dielectric filler; it functions as a dielectric layer to expand the capacitance of capacitor 10. Dielectric layer 15 is made of, for example, resin such as epoxy or polyimide, but may also be made of such resin filled with ferroelectric filler.

Dielectric layer 15 features an adequate level of plasticity and is transformed to fill the space along the concave-convex structures on substrate 11, 12. Dielectric layer 15 is structured to have a certain thickness of, for example, 10 μm, so that it can provide a predetermined amount of capacitance and a required level of tolerance to pressure capacitor 10 to be formed. Also, terminals (16v), (17g), (16s), (17s) pass through dielectric layer 15.

Terminals 16 are made of conductive material such as a metal, for example, copper (Cu) or the like. Insulation film 25 is formed between terminals 16, 17 and substrates 11, 12. Terminals (16v), (17v) of interconnecting conductor (Iv) are connected to upper electrode 14. Terminal (16v) is part of the second conductive part, and terminal (17v) is part of the first conductive part. Electrode 14 is the power-source-side electrode in capacitor 10. Terminals (16g), (17g) of interconnecting conductor (Ig) are connected to lower electrode 13. Terminal (16g) is one section of the first conductive part and terminal (17g) is one section of the second conductive part. Electrode 13 is the ground-side electrode in capacitor 10. Terminals (16s), (17s) of interconnecting conductor (Is) are connected to each other. Interconnecting conductor (Is) connects signal terminal (Ts) of semiconductor chip 50 to signal line (Ls) of circuit substrate 40. Signal terminal (Ts) is not connected to capacitor 10.

Metal layers 20 made of, for example, gold (Au) or nickel (Ni), are formed on terminals 16. Metal layers 20 are formed to protect terminals 16 from corrosion. Bumps 22 made of solder layers are formed on metal layers 20. Insulation layers 18, 19 are used as solder resist when bumps 22 are formed and when interposer 30 is connected to circuit substrate 40 or semiconductor chip 50. Also, insulation layers 18, 19 are used as a mask when forming metal layers 20.

As described above, at capacitor 10, according to an example of the present invention, moisture absorption of dielectric layer 15 is prevented by sandwiching both surfaces of dielectric layer 15 between substrates 11, 12. As described in detail later, it is extremely rare for dielectric layer 15 to be exposed to an etching solution or the like when electrodes 13, 14 and terminals 16 are formed. Also, to make thin substrates, the steps of laminating or exfoliating support substrates are not required. As a result, capacitor 10, having dielectric layer 15 with a low rate of degradation, can be produced at a stable quality.

Next, a method for manufacturing capacitor 10 having the above features is described with reference to the drawings.

The below method is an example, to which manufacturing capacitor 10 is not limited as long as the same result is achieved.

Figure 4A:
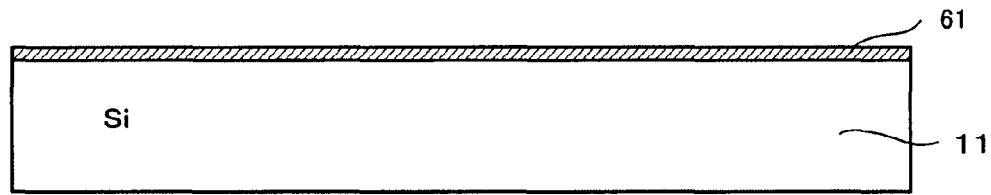
FIGS. 4A-4U are illustrations to show a method for manufacturing the capacitor related to an example of the present invention.
Figure 4B:
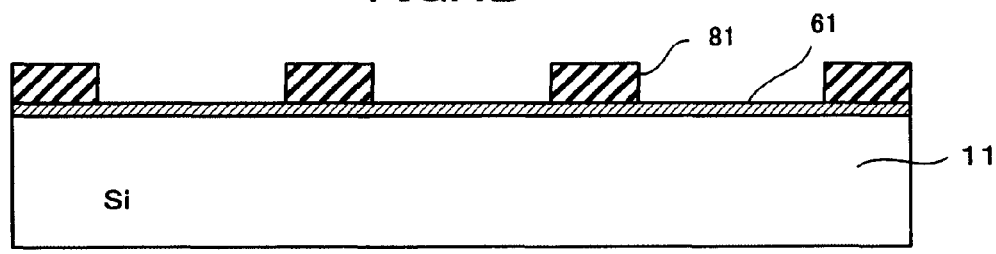

First, substrate 11 is prepared. For example, an 80 μm-thick single crystalline silicon substrate is used to make substrate 11. After cleaning and clearing the surface of substrate 11 of dust or the like, material such as Ni/Cr or the like is deposited by sputtering to form an approximately 100 nm-thick hard mask layer 61 on a surface as shown in FIG. 4A. Then, as shown in FIG. 4B, resist pattern 81 is formed on hard mask layer 61 by photolithography or the like. Resist pattern 81 has openings in the area where concaves 71 will be formed.

Figure 4C:
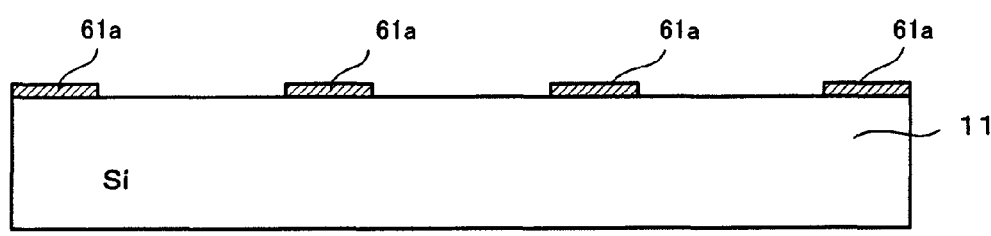
Figure 4D:
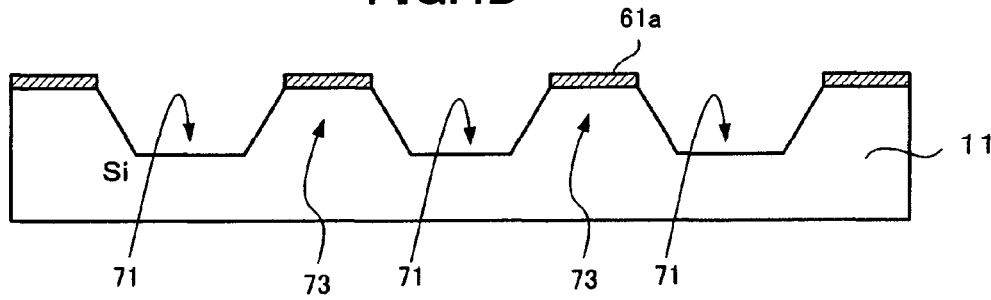

As shown in FIG. 4C, using resist pattern 81 as a mask, the areas corresponding to concaves 71 on hard mask layer 61 are removed using an etching solution to form hard mask (61a). Using hard mask (61a) as a mask, concave 71 on substrate 11 is formed as shown in FIG. 4D by anisotropically etching substrate 11 made of single crystalline silicone with a KOH solution or the like. The portion remaining under hard mask layer 61 becomes convex 73. The depth of concave 71 is, for example, approximately 50 μm.

Figure 4E:
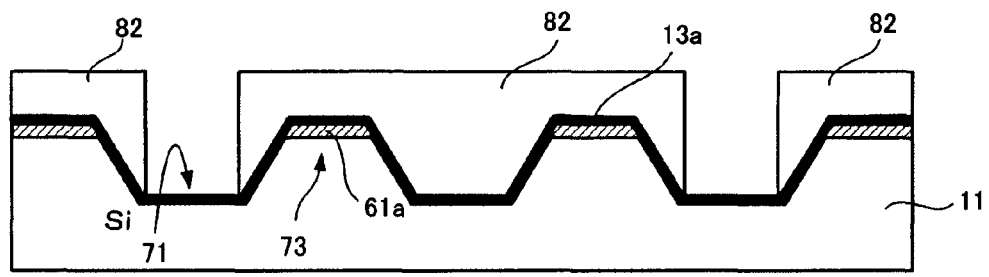

Electrode layer (13a) is formed to be approximately 100 nm thick on the surface of substrate 11, where concaves are formed, by depositing copper (Cu) using, for example, electrode sputtering. Electrode layer (13a) will later become electrode 13. Here, hard mask (61a) may be removed before electrode layer (13a) is formed, but such a step is not necessary since hard mask (61a) would not be exposed to the surface on which dielectric layer 15 is formed, and thus no effect on electric characteristics is expected. As shown in FIG. 4E, resist pattern 82 is formed on electrode layer (13a) by photolithography or the like. Resist pattern 82 has openings corresponding to the area where openings 75 will be formed.

Figure 4F:
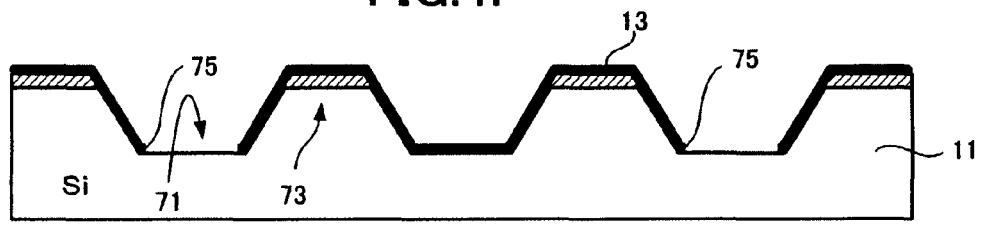

Using resist pattern 82 as a mask, electrode layer (13a) is etched with a mixed solution containing sulfuric acid and hydrogen peroxide or the like to form electrode 13 with openings 75 as shown in FIG. 4F.

Figure 4G:
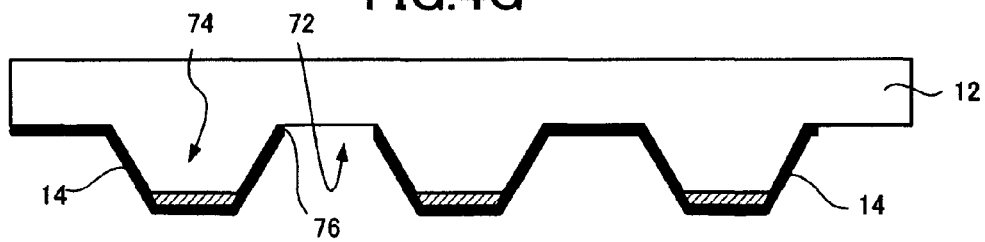

Following the same steps illustrated in FIGS. 4A-4F, substrate 12 is etched anisotropically to make concave 72, and then electrode 14 with openings 76 is structured as shown in FIG. 4G. Convex 73 of substrate 11 is formed to align with concave 72 of substrate 12. Convex 74 of substrate 12 is formed to align with concave 71 of substrate 11.

Figure 4H:
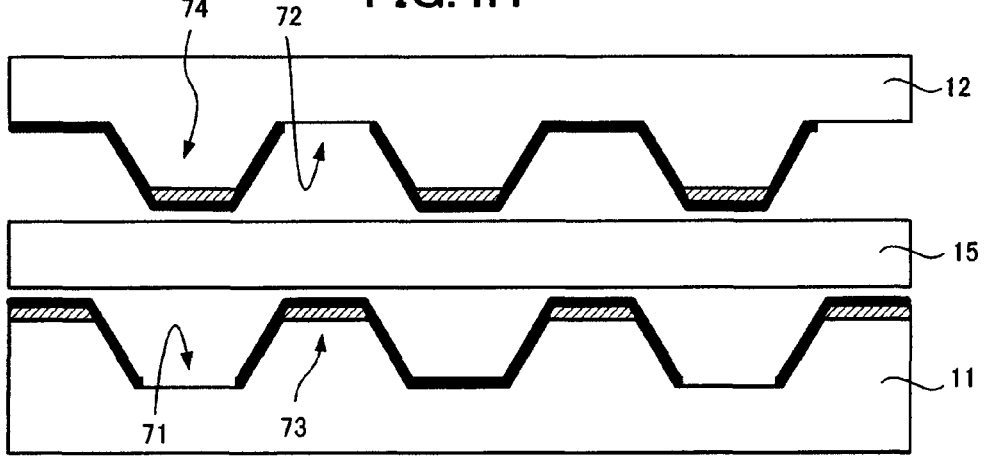
Figure 4I:
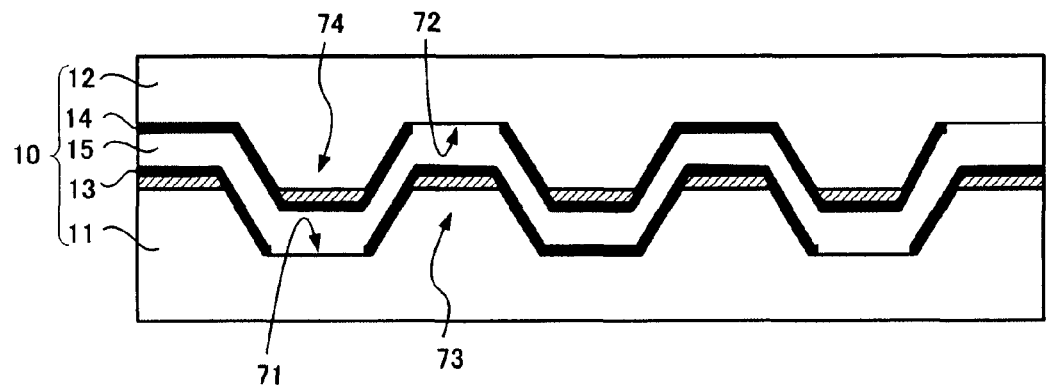

Next, dielectric layer 15 is prepared using resin or resin containing dielectric filler. As shown in FIG. 4H, substrates 11, 12 are aligned facing each other where the concave-convex structure is formed, sandwiching dielectric layer 15 in between. Then, substrates 11, 12 are compressed together so that dielectric layer 15 is transformed along the concave-convex structure. As a result, concaves 71, 72 and convexes 73, 74 are filled with dielectric layer 15 without leaving any space. The thickness of dielectric layer 15 is adjusted in advance so that the space between substrates 11, 12 is filled evenly when substrates 11, 12 are positioned at a predetermined distance. The step to compress substrates 11, 12 with dielectric layer 15 sandwiched in between is conducted at least in a dry-air atmosphere, preferably in a vacuum condition. This is to prevent dielectric layer 15 from absorbing moisture and to further avoid potential defects.

Figure 4J:
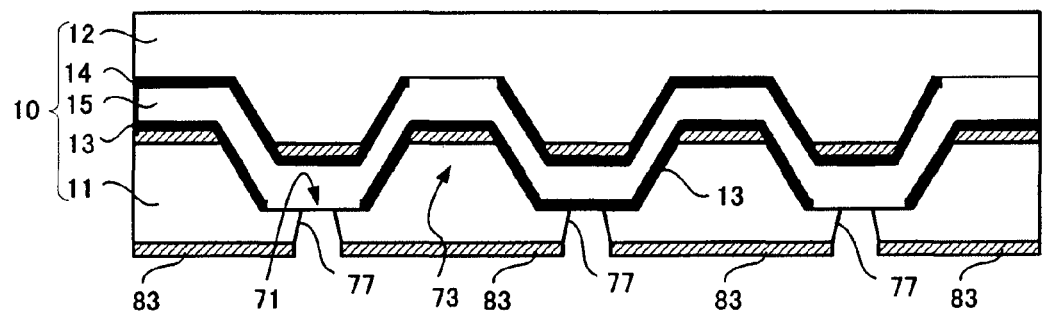

FIG. 4J illustrates that holes for structuring terminals 16 are formed in one of the substrates. To minimize the height of interposer 30, the outer surface of substrate 11 (the lower surface in FIG. 4J) is sanded by CMP (Chemical Mechanical Polishing). Since substrate 12 works as a support, another support substrate is not required during the CMP process.

Following the same steps illustrated in FIGS. 4A-4C, opening 77 is formed. Namely, a hard mask layer is formed on one side by sputtering Ni/Cr or the like to be approximately 100 nm thick. Then, a resist pattern (not shown in the drawing) is formed on the hard mask layer by photolithography or the like. The resist pattern has openings in the area corresponding to openings 77. Using the resist layer as a mask, hard mask 83 is formed by etching with an etching solution and removing the area corresponding to concave 77 of the hard mask layer. Using hard mask 83 as a mask, opening 77 is formed in substrate 11 by anisotrophically etching single-crystalline silicon substrate 11 with a KOH solution or the like as shown in FIG. 4J.

Figure 4K:
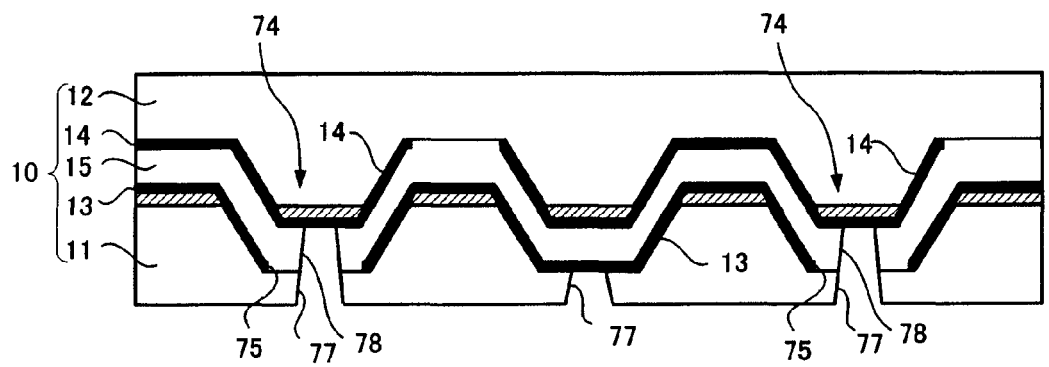

FIG. 4K illustrates a step where openings are structured to form terminal (16v) in the dielectric layer. To construct terminal (16v), hard mask 83 is exfoliated and removed, and opening 78 is formed in dielectric layer 15 by beaming a laser through opening 77. Since dielectric layer 15 is made of resin, it can be laser-processed without damaging electrode 14 and substrate 11. Terminal (16g) is formed in opening 77, which is prescribed to reach electrode 13, and thus no laser treatment is necessary.

Figure 4L:
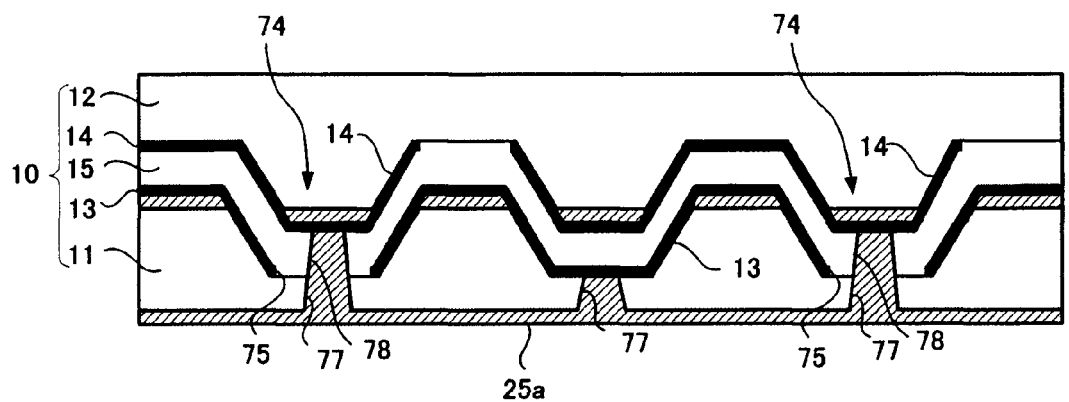
Figure 4M:
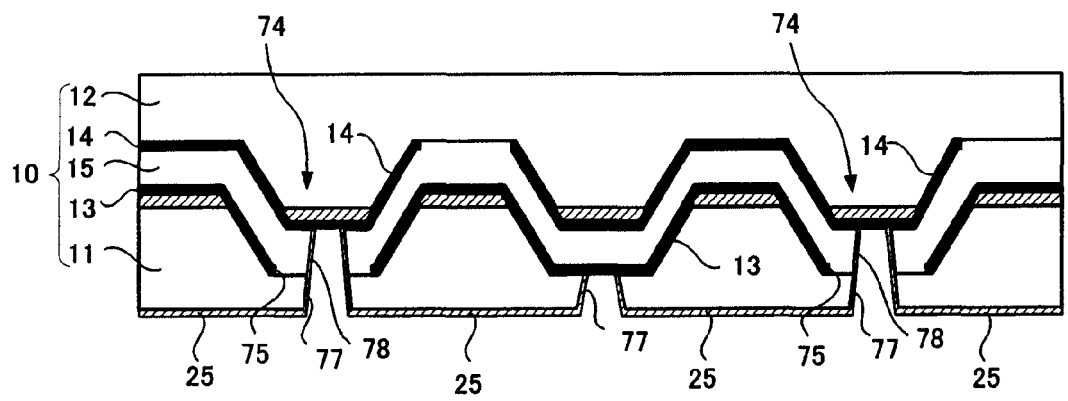

FIGS. 4L and 4M illustrate the steps to form insulation film 25 on the surfaces of substrate 11 and openings 77, 78. Insulation material (25a) such as resin film or the like is laminated on the surface of substrate 11 (see FIG. 4L). To expose electrodes 13, 14 at the bottom of openings 77, 78, insulation material 25 is bored using, for example, a CO2 laser, and insulation film 25 is formed.

Insulation film 25 is formed to secure insulation and to protect substrate 11 and dielectric layer 15 during the manufacturing process of terminals 16. Insulation film 25 may be formed using resin film or the like or employing other methods such as forming an oxidized film or the like. Insulation film 25 is omitted from FIGS. 4N-4U to simplify the drawings.

Figure 4N:
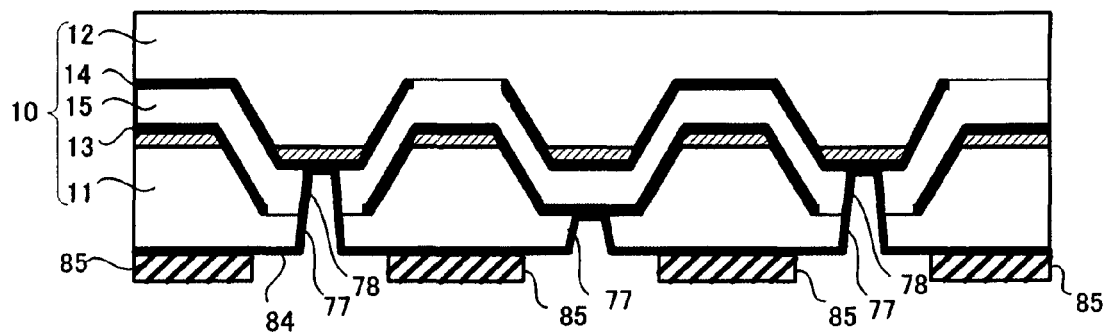

FIG. 4N illustrates a preliminary step to form terminals 16. Seed layer 84 is deposited by sputtering metals such as copper (Cu) or the like on the surfaces of substrate 11 and openings 77, 78. A resist layer is formed on seed layer 84, then resist 85 is formed after removing (patterning) the areas where terminals 16 will be formed.

Figure 4O:
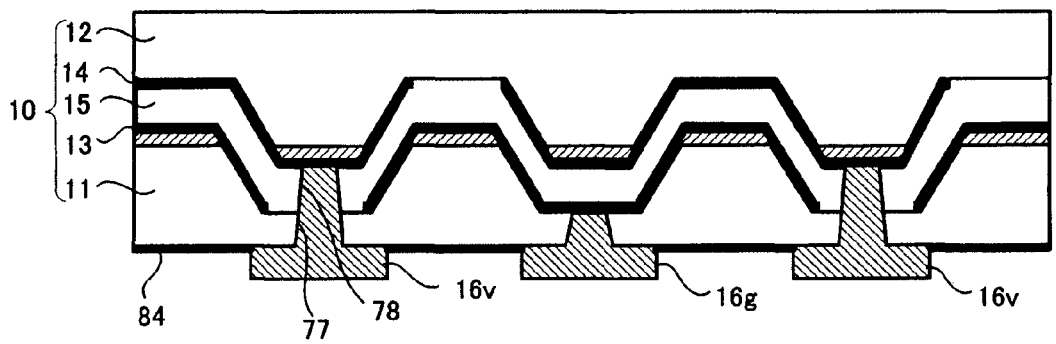

Copper (Cu) is plated using seed layer 84 as an electrode, and terminals (16v), (16g) are formed in the area where resist 85 is not formed. Then, as shown in FIG. 4O, resist 85 is removed. At this step, terminals 16 are electrically connected with each other by means of seed layer 84.

Figure 4P:
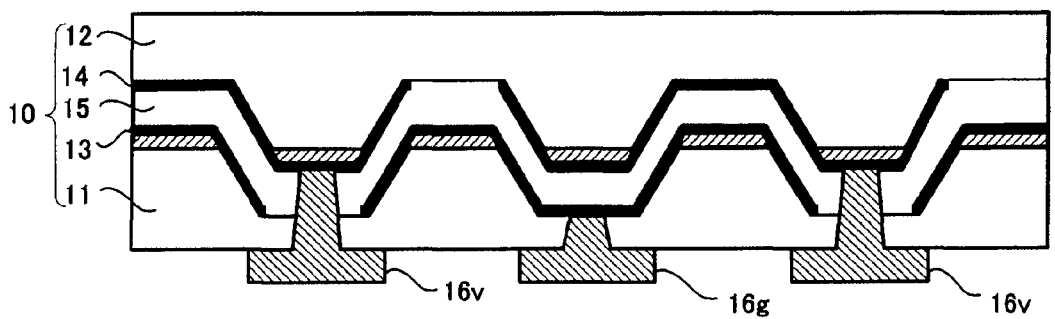

After seed layer 84 is removed by etching, terminals (16v), (16g) remain electrically disconnected from each other as shown in FIG. 4P. When seed layer 84 is etched, the surface of terminals 16 is also etched. However, terminals 16 mostly remain, since seed layer 84 is extremely thin. As a result, terminal (16v) connected to upper electrode 14 and terminal (16g) connected to lower electrode 13 are formed. Terminal (16s), which is not connected to electrodes 13, 14 (see FIG. 1), is structured to reach substrate 12 as terminal (16v) does. Terminals 16 may be filled by printing conductive material.

Figure 4Q:
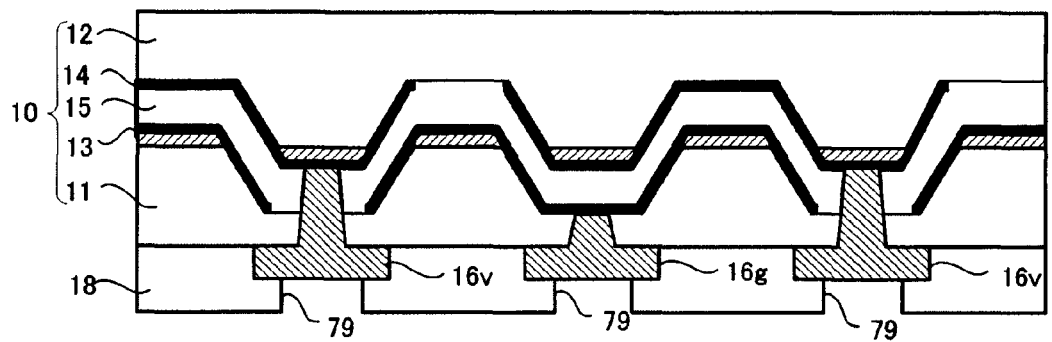

FIG. 4Q is a cross-sectional view illustrating insulation layer 18 formed on substrate 11 and terminals 16. Insulation material (solder-resist) is coated and patterned using photolithography to form insulation layer 18 having openings 79 on terminals 16.

Figure 4R:
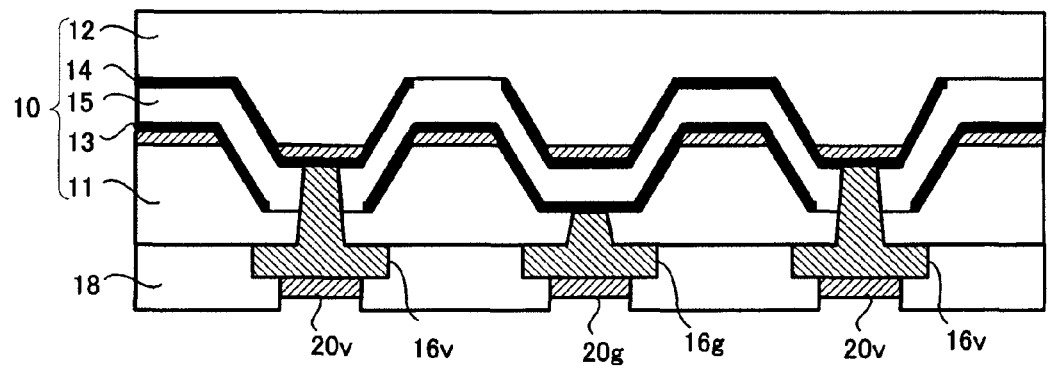

Through openings 79, electroless nickel (Ni) or gold (Au) is formed on terminals 16, and metal layers (20v), (20g) are formed as shown in FIG. 4R. The thickness of metal layers (20v), (20g) is, for example, approximately 5 μm.

Figure 4S:
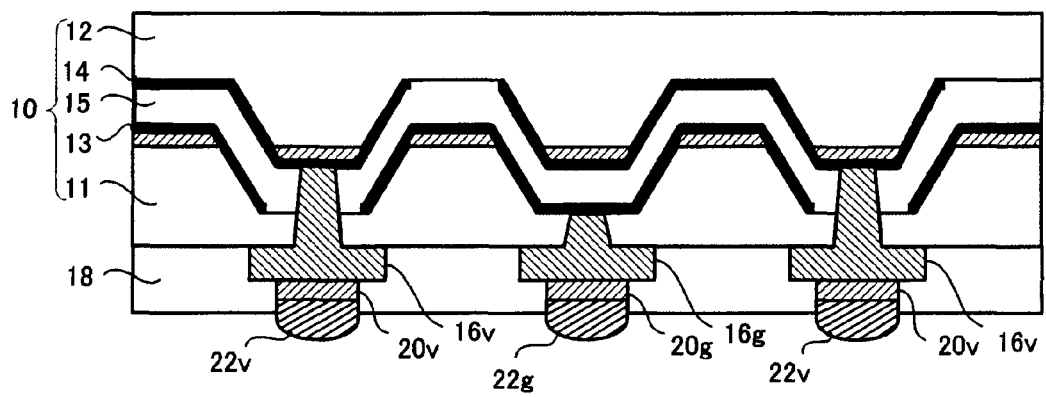

As shown in FIG. 4S, bumps (22v), (22g) are formed by depositing solder layers on metal layers (20v), (20g) respectively. The thickness of bumps (22v), (22g) is, for example, approximately 30 μm.

Figure 4T:
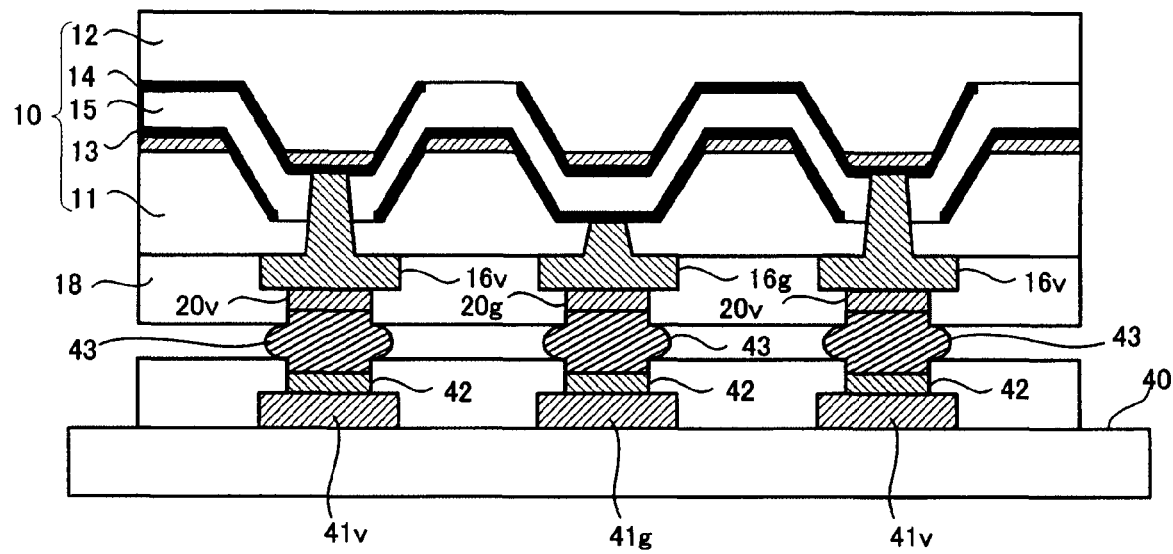

FIG. 4T is a cross-sectional view illustrating interposer 30 connected to circuit substrate 40. Interposer 30 is mounted on circuit substrate 40 by aligning wirings (41g), (41v), metal layer 42 and bump 43 on circuit substrate 40, which are formed in the areas corresponding to interconnecting conductors (Ig), (Iv) of interposer 30. Bumps (22v), (22g) and bump 43 are fused in a reflow furnace. Interconnecting conductors (Ig), (Iv) are electrically connected to wirings (41g), (41v) of circuit substrate 40 respectively. Terminals (16v), (16g) and wirings (41v), (41g) may be bonded through a pressure-bonding process of metals (Cu—Cu bonding).

Figure 4U:
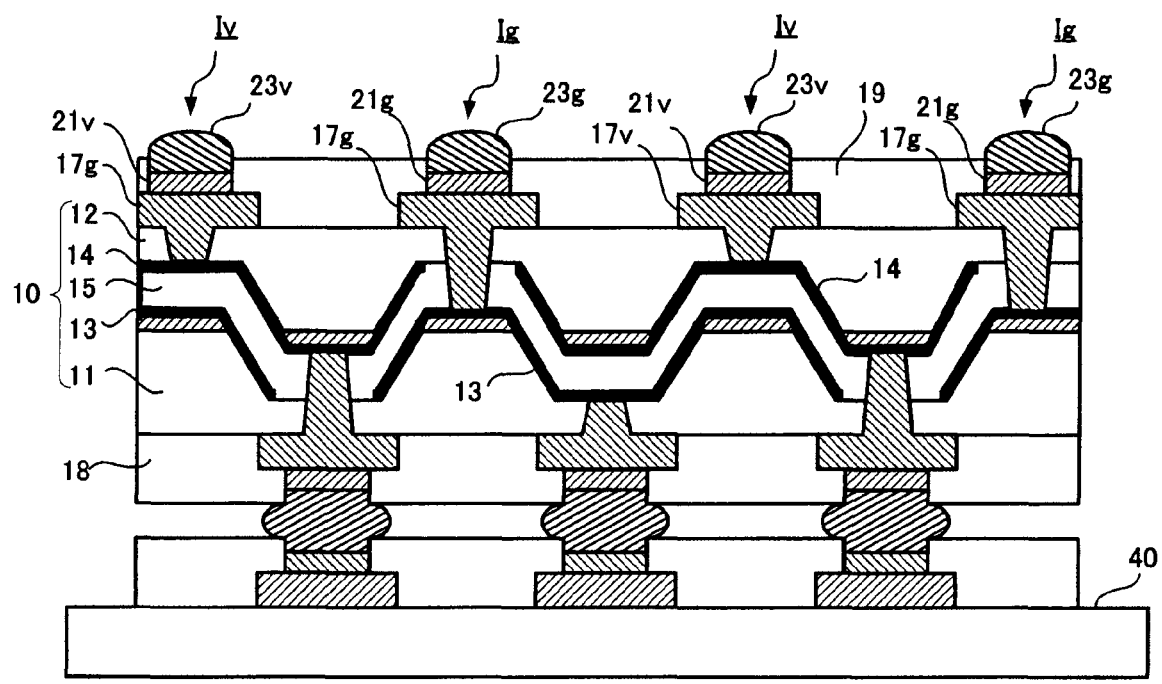

FIG. 4U illustrates the step where interconnecting conductors are formed on substrate 12 of interposer 30. Following the same steps illustrated in FIGS. 4J-4S, interconnecting conductors (Ig), (Iv) are formed on substrate 12. First, to minimize the height of interposer 30, the outer surface (the upper surface in FIG. 4U) of substrate 12 is sanded using CMP (Chemical Mechanical Polishing). Since interposer 30 is anchored to circuit substrate 40, no support substrate needs to be laminated.

Next, a hard mask is formed, which is then used as a mask to structure openings by etching the areas where terminals 17 will be formed. During that step, although not shown in FIG. 4U, an opening to construct terminal (17s) reaches terminal (16s). Furthermore, an opening where terminal (17g) will be formed is bored in dielectric layer 15 by beaming a laser through an opening. As described in FIGS. 4L and 4M, insulation film 25 (not shown in the drawing) is formed on the surfaces of substrate 12 and its openings. A seed layer is deposited by sputtering on the surfaces of substrate 12 (insulation film 25) and its openings. A resist is structured having openings in the areas where terminals 17 will be formed. Copper (Cu) is plated using the seed layer as an electrode to form terminals (17v), (17g). After the resist is removed and the seed layer is etched away, terminals (17v), (17g) remain electrically disconnected from each other. Although not shown in FIG. 4U, terminal (17s) is formed using the same step.

Insulation layer 19 is patterned by photolithography, and metal layers (21v), (21g) are formed on terminals (17v), (17g). Then, solder bumps (23v), (23g) are formed. Accordingly, interconnecting conductor (Ig) connected to electrode 13, interconnecting conductor (Iv) connected to electrode 14 and interconnecting conductor (Is) connected to terminal (16s) are formed (see FIG. 1)

Electronic circuit package 100 is structured by aligning semiconductor chip 50 on top of interposer 30 using bumps (23v), (23g).

Capacitor 10 is manufactured according to the steps described above. Except when dielectric layer 15 is partly exposed to an etching solution when opening 77 is formed in substrates 11, 12, and also exposed under laser beams when opening 78 is formed, dielectric layer 15 of capacitor 10 is not affected by moisture absorption or scattered impurities after the seed layer is formed in openings 77, 78. Accordingly, impact from moisture absorption from a wet process or during device usage can be lowered. During the device usage, moisture absorption at the dielectric is prevented, since the dielectric resin is not exposed, but is inside the substrate. For example, moisture is seldom collected at cracks in the dielectric, and thus any shortage between electrodes through such collected moisture is controlled. Also, since substrate 12 works as a support substrate, the steps of laminating and exfoliating a support substrate to maintain a thin substrate are not required. As a result, residues from laminating a support substrate or the like do not affect the dielectric.

Above-described interposer 30 may be stacked in two or more layers to structure a multilayered interposer. In a multilayered interposer, if interconnecting conductors (Ig) on the ground side of each interposer are connected to each other, and interconnecting conductors (Iv) on the power-source side of each interposer are connected to each other, capacitor 10 of each layer is arranged in a parallel circuit, and the capacitance of the capacitor connected to a semiconductor chip terminal can be expanded.

A Modification of Example 1

Figure 5:
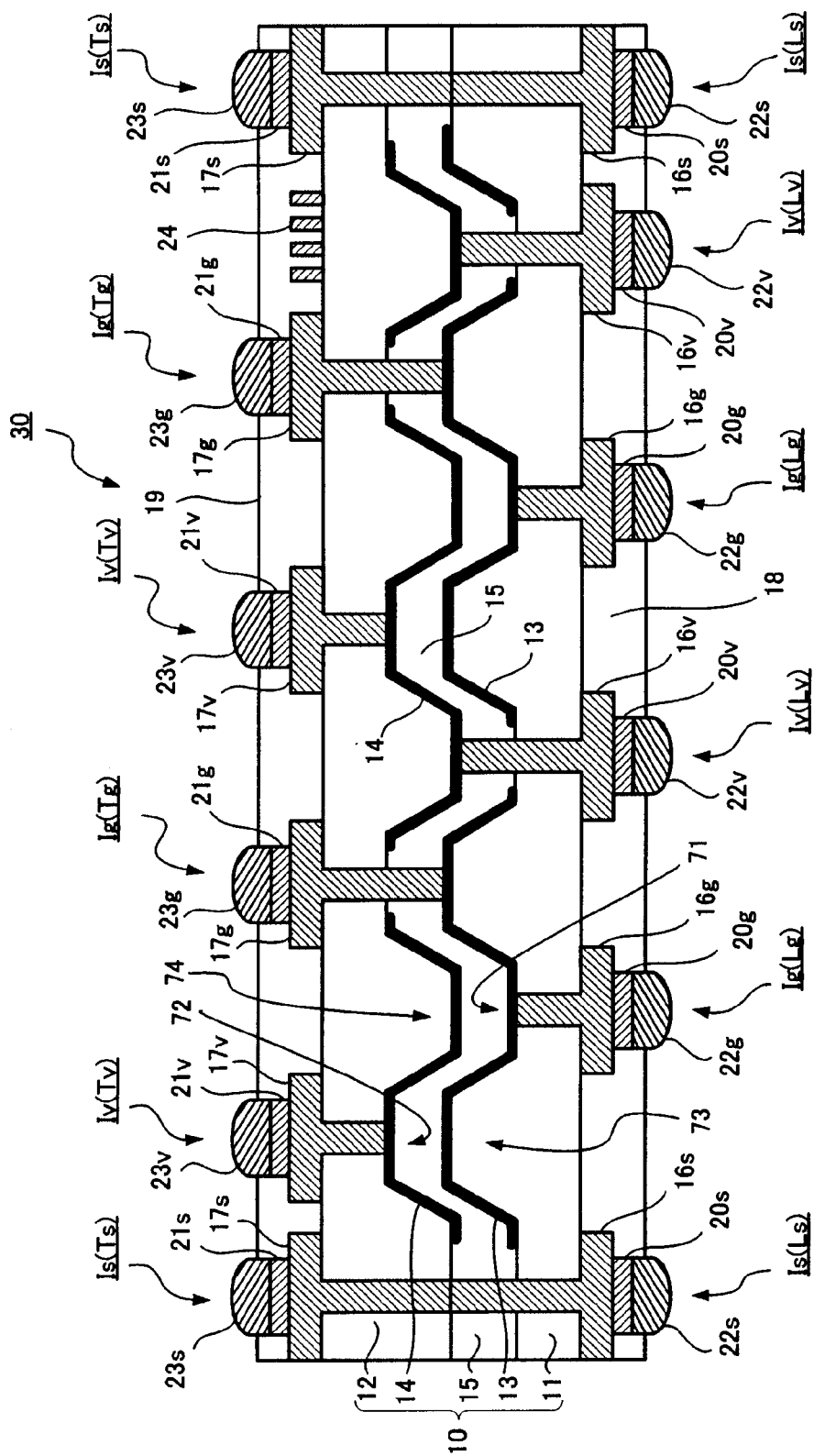
FIG. 5 is a cross-sectional view of a different structural example of the interposer having a capacitor related to an example of the present invention.

FIG. 5 is a cross-sectional view of a modified structure of the interposer having a capacitor related to an example of the present invention. According to the example shown in FIG. 5, inductor 24 is structured on the surface of substrate 12 in interposer 30. As shown in FIG. 5, an inductor or resistor may be formed on the surface of the interposer.

In the step to form an inductor or a resistor on the surface of interposer 30, dielectric layer 15 is not exposed to an etching solution or the like, since dielectric layer 15 is covered by substrate 12. When an electronic device is mounted on the surface of interposer 30, there is no risk of degradation to capacitor 10.

Interposer 30, with reference to FIG. 5, may also be stacked in two or more layers to structure a multilayered interposer. Regarding the inductors or resistors connected to a semiconductor chip terminal, the inductance or resistance can be increased by connecting them in series. Also, a predetermined amount of impedance can be structured by connecting a capacitor, an inductor and a resistor in a combination.

Example 2

Figure 6:
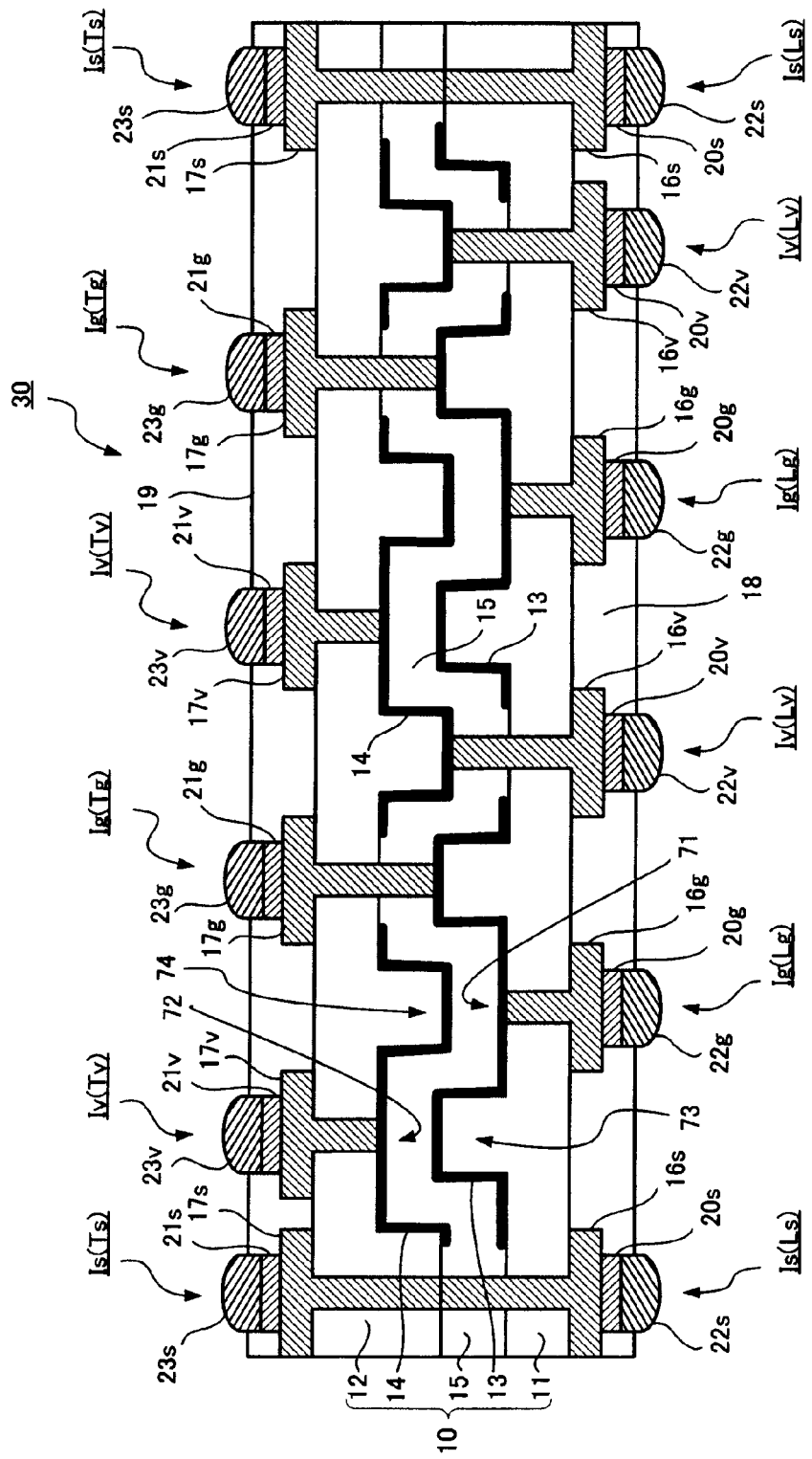
FIG. 6 is a cross-sectional view of the structure of an interposer having a different capacitor related to an example of the present invention.

FIG. 6 is a cross-sectional view of an interposer having a differently structured capacitor related to an example of the present invention. According to Example 2, substrates 11, 12 are made of glass or ceramic.

According to the example shown in FIG. 6, substrates 11, 12 are made of glass, and concaves 71, 72 are formed by etching using, for example, hydrofluoric acid (HF) or the like. The example in FIG. 6 shows that concaves having an almost rectangular cross-sectional shape are formed by isotropic etching. In this example, concaves 71, 72 and convexes 73, 74 are also formed in such a way that the concave-convex structures on substrates 11, 12 align with each other. Convex 73 of substrate 11 aligns with concaves 72 of substrate 12 while maintaining a space in between; and convex 74 of substrate 12 aligns with concave 71 of substrate 11 while maintaining a space in between. Electrodes 13, 14 are formed along the concave-convex structures formed on each facing surface of substrates 11, 12. Dielectric layer 15 is sandwiched into the space between substrates 11, 12.

By forming concaves 71, 72 and convexes 73, 74 in substrates 11, 12 to align with one another, surface sizes of electrodes 13, 14 per unit surface of interposer 30 are increased while maintaining the space between electrodes 13, 14. Accordingly, the capacitance of capacitor 10 is expanded.

In Example 2 shown in FIG. 6, since dielectric layer 15 is also sandwiched between substrates 11, 12, moisture absorption at dielectric layer 15 is prevented. It is extremely rare for dielectric layer 15 to be exposed to an etching solution or the like when electrodes 13, 14 and terminals 16 are formed. Also, to make thin substrates, the steps of laminating or exfoliating support substrates are not required. As a result, capacitor 10, having dielectric layer 15 with a low rate of degradation, can be produced at stable quality.

It should be understood that the examples disclosed above are to be considered in all respects as illustrative and that the present invention should not be limited to those examples. It is indicated that the scope of the present invention is shown by the scope of the claims, not by the above description of the examples, and all the changes within the claim scope and equivalent interpretation should be included.

POTENTIAL INDUSTRIAL USE OF THE PRESENT INVENTION

In an interposer of the present invention, moisture is not adsorbed at the dielectric layer structured in the capacitor, and degradation of the dielectric layer related to residues resulting from laminating a support substrate or the like can be avoided. An electronic circuit package having the interposer of the present invention can maintain a stable quality without electric degradation of the capacitor.

The invention claimed is:

1. An interposer comprising:
a first substrate having a concave-convex surface;
a second substrate positioned parallel to the first substrate and having a concave-convex surface which faces the concave-convex surface of the first substrate;
a capacitor formed between the first substrate and the second substrate and comprising a first electrode formed on the concave-convex surface of the first substrate, a second electrode formed on the concave-convex surface of the second substrate and a dielectric layer sandwiched between the first and second electrodes;
a first conductive structure passing through the first substrate, the first electrode and the dielectric layer and being electrically connected to the second electrode at a convex portion of the concave-convex surface of the second substrate; and
a second conductive structure passing through the second substrate, the second electrode and the dielectric layer and being electrically connected to the first electrode at a convex portion of the concave-convex surface of the first substrate,
wherein the convex portions of the concave-convex surfaces of the first and second substrates protrude with respect to the dielectric layer.

2. The interposer according to claim 1, wherein the first and second substrates are made of a material comprising at least one of silicon, glass and ceramic.

3. The interposer according to claim 1, further comprising:
a first insulation layer formed between the first substrate and the first conductive structure such that the first substrate is insulated from the first conductive structure; and
a second insulation layer formed between the second substrate and the second conductive structure such that the second substrate is insulated from the second conductive structure.

4. The interposer according to claim 1, wherein the concave-convex surface of the first substrate and the concave-convex surface of the second substrate are formed such that the convex portion of the concave-convex surface of the first substrate faces a concave portion of the concave-convex surface of the second substrate and that the convex portion of the concave-convex surface of the second substrate faces a concave portion of the concave-convex surface of the first substrate.

5. The interposer according to claim 4, wherein the first and second substrates include single crystalline silicon, and the concave-convex surfaces of the first and second substrates are formed by anisotropic etching.

6. The interposer according to claim 1, wherein the dielectric layer comprises one of a resin and a dielectric filler comprising a resin.

7. The interposer according to claim 1, further comprising:
an inductor disposed on an outer surface of one of the first substrate and the second substrate.

8. The interposer according to claim 1, wherein the first and second conductive structures comprise a copper plating.

9. The interposer according to claim 1, further comprising:
a plurality of metal layers disposed on the first and second conductive structures, respectively, outside of the first and second substrates, and
a plurality of solder bumps disposed on the metal layers, respectively.

10. The interposer according to claim 9, wherein the plurality of metal layers comprise gold or nickel.

11. The interposer according to claim 9, further comprising a plurality of insulation layers disposed on the first and second substrates such that the solder bumps are exposed from the insulation layers.

12. A device structured comprising a plurality of interposers, wherein each of the interposers comprises the interposer according to claim 1, and the first conductive structures of the interposers are connected to each other, the second conductive structures of the interposes are connected to each other, or the first conductive structure of one of the interposers is connected to the second conductive structure of another one of the interposers.

13. An electronic circuit package, comprising the interposer according to claim 1.

* * * * *